United States Patent [19]

Takei et al.

[11] Patent Number: 4,827,867
[45] Date of Patent: May 9, 1989

[54] RESIST DEVELOPING APPARATUS

[75] Inventors: Toshitaka Takei, Suita; Tsunemasa Funatsu, Sakai, both of Japan

[73] Assignee: Daikin Industries, Ltd., Osaka, Japan

[21] Appl. No.: 933,393

[22] Filed: Nov. 21, 1986

[30] Foreign Application Priority Data

Nov. 28, 1985 [JP] Japan .................. 60-268737
Mar. 14, 1986 [JP] Japan .................. 61-57733
May 20, 1986 [JP] Japan .................. 61-115931

[51] Int. Cl.$^4$ .......................... B05C 11/00
[52] U.S. Cl. .......................... 118/64; 118/52; 118/320; 118/326; 118/667; 427/422; 165/156; 165/169; 165/30; 165/64; 134/105; 134/200
[58] Field of Search ............ 118/64, 52, 54, 320, 118/326, 666, 667, 302; 134/105, 107, 153, 157, 200; 427/422, 240; 165/169, 156, 135, 64, 30

[56] References Cited

U.S. PATENT DOCUMENTS

| | | | |
|---|---|---|---|
| 2,114,377 | 4/1938 | Goss | 118/302 X |
| 2,817,600 | 12/1957 | Yahnke | 118/302 X |
| 3,069,143 | 12/1962 | Frolich | 165/135 X |
| 3,108,031 | 10/1963 | Hasala et al. | 134/105 X |
| 3,131,917 | 5/1964 | Gessner et al. | 118/500 X |
| 3,349,840 | 10/1967 | Tope et al. | 165/30 X |
| 4,409,319 | 10/1983 | Colacino et al. | 430/296 |
| 4,610,953 | 9/1986 | Hashimoto et al. | 430/326 X |
| 4,687,051 | 8/1987 | Zemp | 165/61 |

FOREIGN PATENT DOCUMENTS 55-2213 1/1980 Japan .
56-98826 8/1981 Japan .
57-166032 10/1982 Japan .

OTHER PUBLICATIONS

PTO, English translation of Japanese patent 57-166032, Jun. 1987.
PTO, English translation of Japanese patent 56-98826, Jun. 1987.
Electrical Communication, vol. 58, No. 1, 1983, pp. 57-58, Heidenheim, DE; "Constant Temperature Developer".

Primary Examiner—Shrive Beck
Assistant Examiner—Alain Bashore
Attorney, Agent, or Firm—Birch, Stewart, Kolasch & Birch

[57] ABSTRACT

A resist developing apparatus comprising a developing tank consisting of a top portion, a body portion, and a bottom portion, at least one of the top, body, and bottom portions being comprised of an inner wall and an outer wall, a heat exchange chamber being defined between the inner and outer walls for being supplied with a heating medium; a chuck disposed inside the developing tank for holding a work piece in position, a nozzle for spraying chemical liquid toward the work piece held in position by the chuck; a heating medium supply unit for supplying heating medium at a specified temperature to the heat exchange chamber; and piping connecting between the heating medium supply unit and the heat exchange chamber, whereby the interior of the developing tank is adapted to be controlled to a specified temperature.

1 Claim, 7 Drawing Sheets

RESIST DEVELOPING APPARATUS

BACKGROUND OF THE INVENTION

The present invention relates to a resist developing apparatus and more particularly, to a resist developing apparatus for developing a resist layer mounted on a work piece such as a semiconductor wafer, a mask for making a semiconductor device, a photodisk, etc.

Conventionally, a resist developing apparatus of the kind are typically of such design that chemical liquids for developing treatment are sprayed over a semiconductor wafer W housed in a developing tank D by means of a spray means N such as a nozzle, whereby a resist layer of the wafer W is developed, as described in Japanese Patent Laid-open Publication No. 166032/1982, for example, and as illustrated in FIG. 1.

Generally, the chemical liquids referred to above include, in addition to the so-called developer for dissolving the resist layer, a pretreatment liquid to be used prior to the spraying of the developer for removing variations of resist sensitivity due to change of the wafer with time, and a post-treatment liquid for washing the wafer after the developer spraying.

With a recent trend toward higher-density oriented resist patterns, the requirements for conditions of the developing process, especially for temperature conditions, have been increasingly becoming crucial. In an attempt to meet such requirements, an electric heater $H_1$ is disposed in the developing tank D to provide heat so as to maintain the temperature of the tank at a specified level; and a temperature control unit T provided with an electric heater $H_2$ is employed to preheat the developer, one of the different kinds of chemical liquids to be used in the developing process, to a specified temperature. In addition, as FIG. 1 shows, an electric heater $H_3$ is coiled around a developer supply pipe L in order to prevent a drop in the temperature of the developer flowing in the pipeline L. Through such arrangement the temperature of the developer to be sprayed by the spray means N onto the wafer is intended to be maintained at the predetermined value.

However, the use of such heaters $H_1$, $H_2$, $H_3$ as heat sources for regulating the temperature within the tank D and the temperature of the developer may not inhibit any temperature rise due to heat absorption from the outside air, though it is possible to inhibit through heating by the heaters a temperature drop due to outward heat dissipation from the tank D and from the developer. Therefore, the conventional arrangement involves a critical drawback that if the outside temperature is higher than the preset temperature for developing treatment, temperature control is completely impossible.

SUMMARY OF THE INVENTION

The object of the present invention is to provide a resist developing apparatus which permits accurate and reliable control of the temperature of a developing chamber and of chemical liquids to be used for development to any set value, even if the outside temperature is higher than the temperature for developing treatment.

In order to accomplish the object, the resist developing apparatus in accordance with the invention comprises a developing tank consisting of a top portion, a body portion, and a bottom portion, at least one of said top portion, body portion, and bottom portion being comprised of an inner wall and an outer wall, a heat exchange chamber being defined between said inner and outer walls for being supplied with heating medium; a holding means disposed inside said developing tank for holding a photoplate in position; a spray means disposed in said tank for spraying chemical liquid toward the photoplate held by said holding means; a heating medium supply means for supplying heating medium at a specified temperature to said heat exchange chamber, said supply means including a heating medium tank for storing the heating medium, a heating medium temperature control means for regulating the temperature of the heating medium, and a heating medium pump for supply of the heating medium; and piping connecting between said heating medium supply means and said heat exchange chamber.

BRIEF DESCRIPTION OF THE DRAWINGS

This object and features of the present invention will become apparent from the following description taken in conjunction with the preferred embodiments thereof with reference to the accompanying drawings, in which.

Before the description of embodiments of the present invention, it is to be noted that like parts are designated by like reference numerals throughout several views of the accompanying drawings.

DETAILED DESCRIPTION OF PREFERRED EMBODIMENTS

Hereinafter the embodiments of the invention will be described with reference to the accompanying drawings.

Figure 2:
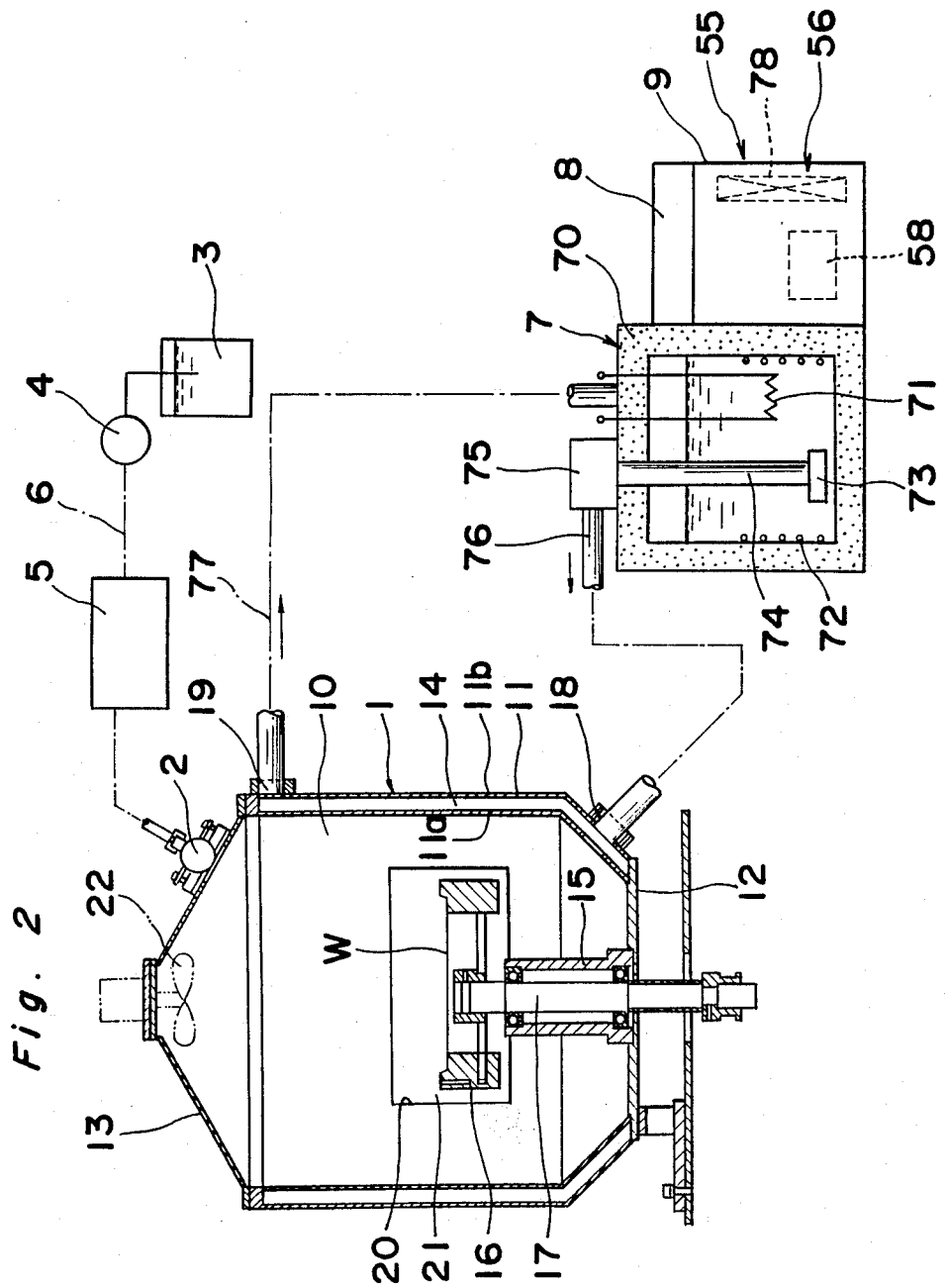
FIG. 2 is a sectional view of a resist developing apparatus representing a first embodiment of the invention.

In FIG. 2, the numeral 1 designates a developing tank, which consists of a double-structured body portion 11 having an inner wall 11a and an outer wall 11b with a heat exchange chamber 14 defined therebetween, a bottom portion 12, and a top portion 13, the interior of the tank 1 forming a developing chamber 10. The heat exchange chamber 14 surrounds the developing chamber 10.

In the bottom portion 12 there is provided a vertically extending cylindrical support member 15 in which there is rotatably supported a rotary shaft 17 having at the upper end thereof a chuck 16 for holding securely in position a photoplate, for example, a semiconductor wafer W. In the top portion 13 as a cover member there is disposed a nozzle 2 as a spray means in opposed relation to the wafer W held by the chuck 16.

This nozzle 2 is connected to a developer tank 3 through a feed pipe 6 with a feed pump 4 and a temperature control unit 5 interposed on the way to the tank 3 so that a temperature-controlled developing solution is supplied from the developer tank 3 to the nozzle 2, which in turn sprays the developer in the form of jets, for example, onto the wafer W.

The provision of the temperature control unit 5 is not necessarily required, but it is intended to control to a specified level the temperature of the developer to be sprayed from the nozzle 2 onto the wafer W. Such temperature control is achievable by the use of constant-temperature water, for example.

Next, a heating medium supply unit 7 will be described. It is to be noted that in the present embodiment, water at a constant temperature is used as a heating medium.

This heating medium supply unit 7 comprises a heating medium tank 70 having a heat insulated structure, an electric heater 71 as a temperature control means, a refrigerating device 55 as another temperature control means, and a heating medium pump 75. In the heating medium tank 70 there is disposed a suction pipe 74 having a strainer 73 located adjacent the bottom of the tank 70, which suction pipe 74 is connected through the heating medium pump 75 and a feed piping 76 to an inlet port 18 located at the bottom of the heat exchange chamber 14. An outlet port 19 located at the top of the heat exchange chamber 14 is connected to the heating medium tank 70 through a return medium piping 77. The refrigerating device 55 comprises an evaporator 72, a compressor 58, a condenser 56, and an expansion valve not shown.

Operation of the heater 71 and the evaporator 72 in the heating medium tank 70 is controlled by a controller 8 which detects the inside temperature of the developing chamber 10 and/or the water temperature (heating-medium temperature) in the heat exchange chamber 14 and compares the detected temperature value with a preset temperature value. Through this operation control of the heater 71 and the evaporator 72 it is possible to provide constant-temperature water (heating medium) at 5° C. to 40° C. with a tolerance of ±0.1° C.

The evaporator 72, together with the compressor 58, is disposed in a condensing unit 9, and operation control of the evaporator 72 is carried out by starting and stopping or volumetric control of the compressor 58. Alternatively, the refrigerating device 55 is continuously operated with the heat amount produced from the heater being controlled, and the temperature of the heating medium is controlled.

In FIG. 2, the reference numeral 20 is an access port for wafers disposed in the body portion 11 of the developing tank 1, which access port 20 has a door 21 attached thereto for opening and closing.

The reference numeral 22 designates a fan mounted to the cover member 13. The fan 22 makes it possible to bring the interior of the developing chamber 10 rapidly to a saturated condition and also serves to enhance heat transfer between the interior of the developing chamber 10 and the inner wall 11a of body portion 11 which defines the heat exchange chamber 14 in conjunction with the outer wall 11b.

Figure 1:
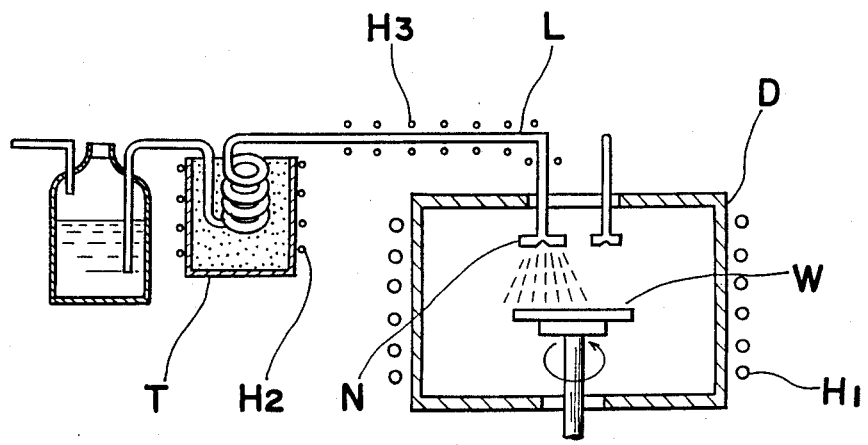
FIG. 1 is a sectional view of a conventional resist developing apparatus.
Figure 3:
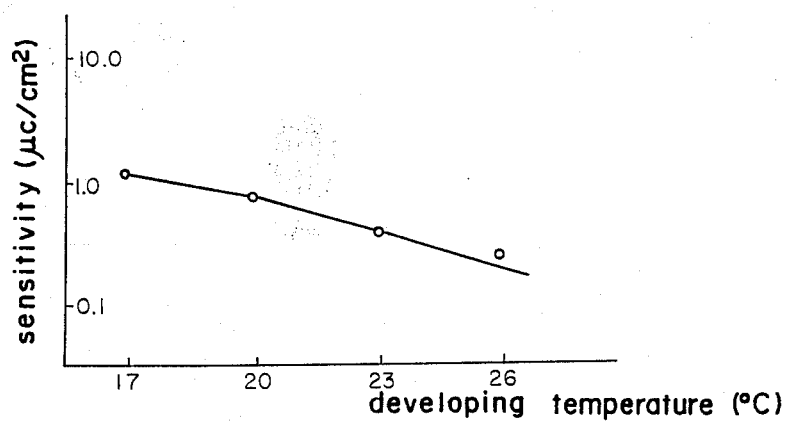
FIG. 3 is a line graph showing a relation between developing temperature and resist sensitivity.

For the developer to be sprayed in jets from the nozzle 2, a mixture of isobutyl alcohol and ethanol at a 50:50 ratio, for example, is used. The relationship between developing temperature (° C.) and resist sensitivity ($\mu c/cm^2$) of the developer will vary as shown in FIG. 3. In FIG. 3, the axis of ordinates is expressed on a logarithmic scale.

To develop a semiconductor wafer W employing the above described arrangement, the heating medium supply unit 7 is first operated and a constant-temperature heating medium to circulate between the heating medium tank 70 and the heat exchange chamber 14 is controlled to a preset temperature.

Temperature setting for this purpose may be arbitrarily done by means of an input device for the controller 8 and the temperature of the heating medium can be thus controlled to the selectively preset temperature value so that the temperature of the developing chamber 10 can be accurately maintained at the preset temperature value.

After the heating medium circulating between the heating medium supply unit 7 and the heat exchange chamber 14 has thus reached the preset temperature, the rotary shaft 17 is actuated to rotate the semiconductor wafers W mounted in the chuck 16 and simultaneously the nozzle 2 is caused to spray jets of developing solution.

Since the temperature of the developing chamber 10 can be maintained at the preset value in advance through the circulation of the constant-temperature heating medium as above mentioned, development can be accurately effected beginning with the first one of the wafers W without requiring a dummy at the start of the developing operation.

Although the temperatue of the developing chamber 10 may tend to change due to the spray of jets of developer from the nozzle 2, the fact that the developing chamber 10 is enclosed brings the interior thereof to a saturated condition immediately upon the spraying of the developer, and further, the possibility of heat entry from outside can be totally neglected by virtue of the heat exchange chamber 14 defined by the inner and outer walls 11a, 11b of the developing tank 1. Therefore, the developing chamber 10 is subject to no temperature change and thus the temperature thereof can be controlled quite accurately. All these facts permit the individual wafers, from the first to the Nth, to be developed accurately at a constant temperature and without sensitivity variation.

Figure 4:
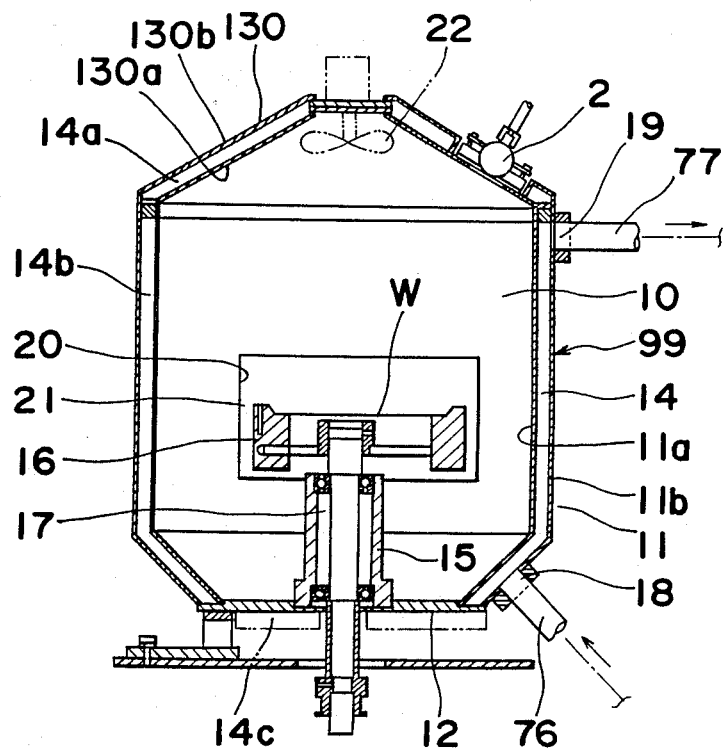
FIG. 4 is a sectional view of a resist devbeloping apparatus representing a second embodiment of the invention.

In the embodiment illustrated in FIG. 2, only the body portion 11 is of a double-wall construction so that a heat exchange chamber 14 is formed only on the side periphery of the developing tank 1; but alternatively, as FIG. 4 illustrates, a cover member 130 of a double wall construction consisting of an inner wall 130a and an outer wall 130b may be employed, for example, instead of the cover member 13 so that a top heat exchange chamber 14a is defined between the inner and outer walls 130a, 130b, the top heat exchange chamber 14a being so constructed as to communicate with a side periphery heat exchange chamber 14b defined by the double wall construction of the body portion 11 so that a heat exchange chamber 14 may be formed in the top portion and side periphery portion of the developing tank 1.

Further, as shown by the imaginary lines in FIG. 4, the bottom portion 12 may be of a double wall construction so as to form a lower heat exchange chamber 14c, which is connected to the side periphery heat exchange chamber 14b, whereby heat exchange chamber 14 is defined in the upper and lower portions and the side peripheral portion of the developing tank 99, or over the entire wall of the developing tank 99. In addition, the figure of the developing tank may be spherical, etc.

Aforesaid top and lower heat exchange chambers 14a, 14c may be constructed in combination with the side periphery heat exchange chamber 14b, but alternatively, such heat exchange chamber 14 may consist of the top heat exchange chamber 14a alone or the lower heat-exchange chamber 14c alone without the provision of the side periphery heat exchange chamber 14b. Or such chamber 14 may consist of the top and lower heat-exchange chamber 14a, 14c in combination and without the provision of the side periphery heat exchange chamber 14b. As another alternative, the heat exchange chamber 14 may consist of any one of the top and lower heat exchange chambers 14a, 14c in combination with the side periphery heat exchange chamber 14b. In the case that a combination of the top and lower heat-exchange chambers 14a, 14c, is employed without the provision of the side periphery heat exchange chamber 14b, the chambers 14a, 14c are connected to each other by a connecting pipe or the like. If only one of aforesaid heat exchange chambers 14a, 14b, 14c is employed, it is needless to say that the feed pipe 76 and the return pipe 77 are connected to the one heat exchange chamber.

Figure 5:
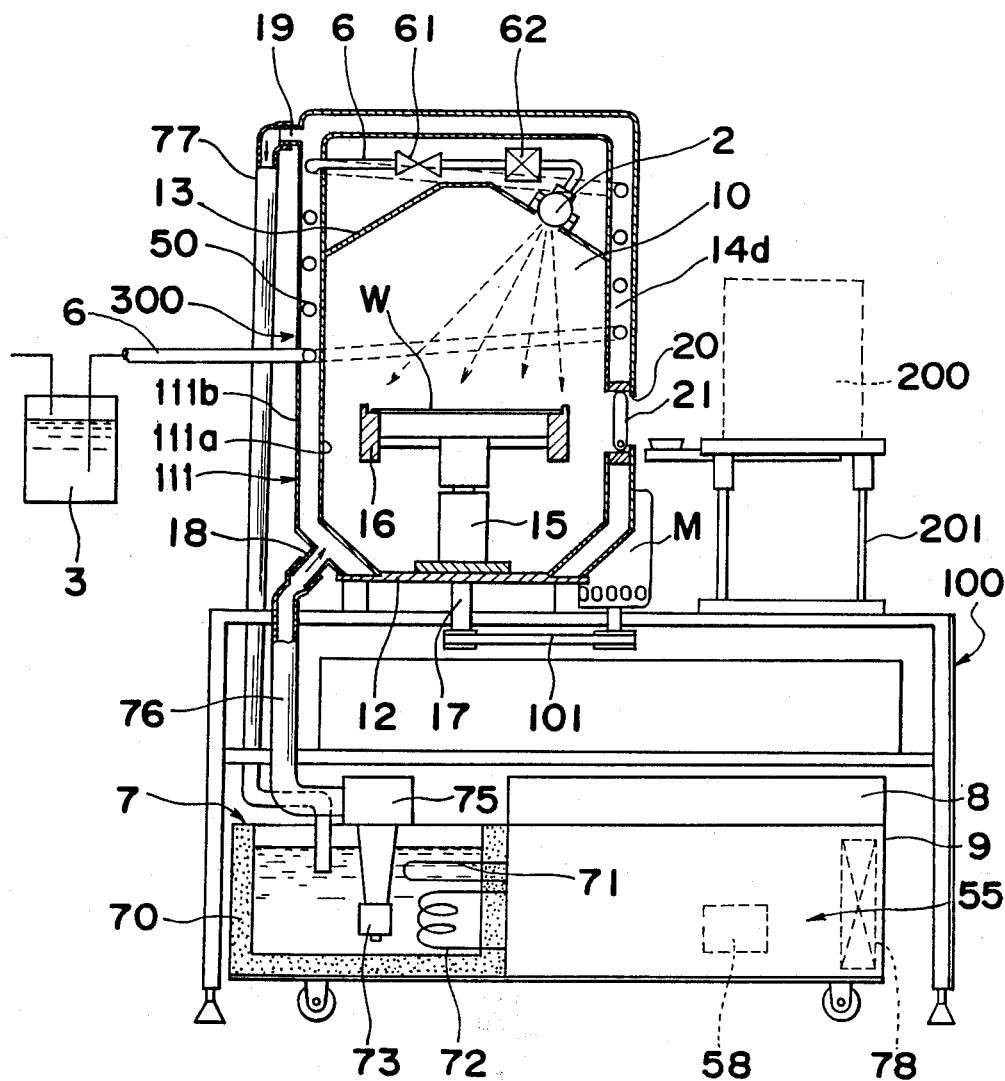
FIG. 5 is a sectional view of a resist developing apparatus representing a third embodiment of the invention.

A third embodiment shown in FIG. 5 is such that a developing tank 300 is supported on the top of a frame 100, with the heating medium supply unit 7 housed in a lower portion of the latter.

The developing tank 300 comprises a dome-shaped casing 111 of a double-wall construction having an inner wall 111a and an outer wall 111b, a bottom wall 12 constituting the bottom, and a ceiling plate 13 constituting the top, a developing chamber 10 being defined within the casing 111, with a heat exchange chamber 14d defined between the inner and outer walls 111a, 111b of the casing 111 so as to surround the developing chamber 10.

On the bottom wall 12 there is uprightly disposed a cylindrical support member 15 in which a rotary shaft 17 having at the upper end thereof a chuck 16 for holding photoplates, for example, semiconductor wafers W is rotatably supported. On the ceiling plate 13 there is provided a spray means 2, such as a nozzle for example, for spraying jets of developer (one of the different kinds of chemical liquids for developing treatment) onto the wafers W securely held by the chuck 16.

The spray means 2 is connected through the feed pipe 6 to the developer tank 3 which is a pressure tank so that jets of developer are sprayed from the spray means 2 onto the wafers W in such a manner as shown by dotted arrows in the figure.

A part of the feed pipe 6 is coil-shaped to form a chemical liquid heat exchanger 50 and this heat exchanger 50 is disposed in aforesaid chamber 14d.

The internal volume of the heat exchanger 50 is preferably of the order of more than the quantity of the developer used for one cycle of development, or more than approximately 200–400 cc. In the feed pipe 6 and at locations adjacent the spray means 2 there are interposed a control valve 61 for controlling start and stop of developer feed to the developing chamber 10 and a strainer 62 for removal of fine dust in the developer.

Next, the constant-temperature heating medium supply unit 7 will be described. It is to be noted in this connection that water is used as a constant-temperature heating medium in this embodiment.

This heating medium supply unit 7 comprises a heating medium tank 70 having a heat insulated structure, and a heater 71 and a refrigerator 55, both disposed in the unit 7, with a strainer 73 adjacent the bottom of the tank 70. A heating medium pump 75 is connected through a feed pipe 76 to an inlet port 18 located at the bottom of the heat exchange chamber 14d, and an outlet port 19 on the top of the heat exchange chamber 14d is connected to the heating medium tank 70 through a return pipe 77.

Operation of the heater 71 and an evaporator 72 in the refrigerator 55 disposed in the heating medium tank 70 is controlled by the controller 8 which detects the internal temperature of the developing chamber 10 and/or the temperature of water (heating medium) in the heat exchange chamber 14d and compares the detected temperature value with the preset temperature value, and through the operation control of the heater 71 and the evaporator 72 it is possible to provide a constant-temperature water (heating medium) supply at 5° C. to 40° C. with a tolerance of ±0.1° C.

A condenser 78 of the refrigerating unit 55 which corresponds to the evaporator 72 is disposed in a condensing unit 9 in conjunction with a compressor 58 and operation control of the evaporator 72 is carried out by start - stop control or volumetric control of the compressor 58.

In FIG. 5, the reference numeral 20 designates an access port for wafers in the body portion 111 of the developing tank 300, which access port 20 has a door 21 attached thereto for opening and closing.

The numeral 200 designates a wafer cassette placed on a table 201 mounted on the top of the frame 100, and the reference character M designates a motor for driving the rotary shaft 17 for the chuck 16 disposed in the developing tank 300, which motor M is connected by a belt transmission means 101 to the rotary shaft 17.

In order to develop semiconductor wafers W by employing the above described arrangement, the heating medium supply unit 7 is first operated and the constant-temperature heating medium circulating between the tank 70 and the heat exchange chamber 14d is controlled to a preset temperature value.

The temperature setting may be effected as desired by means of the input device for the controller 8 so that the temperature may be accurately controlled to the preset value. Thus, the temperature of the developing chamber 10 may be accurately maintained at the preset temperature.

After the temperature of the constant-temperature heating medium in circulation between the heating medium supply unit 7 and the heat exchange chamber 14d has reached the preset value, the rotary shaft 17 is driven to rotate the semiconductor wafers W held in the chuck 16 and simultaneously jets of developer are sprayed from the nozzle 2.

Since the developing chamber 10 can be maintained constant at the preset temperature through the circulation of the constant-temperature heating medium in the chamber 14d, and since the temperature of the developer is controlled prior to the start of developing operation to the same temperature as that of the developing chamber 10 by the heat exchanger 50 disposed in the chamber 14d, development may be accurately performed beginning with the first one of the semiconductor wafers W without requiring the use of a dummy at the start of developing operation.

Although the temperature of the developing chamber 10 may tend to change as jets of developer are sprayed by the spray means 2, the fact that the developing chamber 10 is sealed will permit the interior thereof to be in a saturated condition simultaneously upon the spraying of the developer in jets, and further, the possibility of heat entry from outside may be neglected by virtue of the heat exchange chamber 14d defined by the inner and outer walls of the developing tank 300. Therefore, the temperature of the developing chamber 10 may be very accurately controlled without being subject to change and thus development of the individual wafers W may be effected very accurately at the desired constant temperature, from the first one of the wafers W to be required, without sensitivity variation.

Furthermore, since the heat exchanger 50 which regulates the temperature of the developer is disposed in the heat exchange chamber 14d which controls the ambient temperature of the developing chamber 10, there is no variation possibility with respect to the temperature of the developing chamber 10 and that of the developer; therefore, the developing temperature on the face of each wafer W may be controlled with high accuracy.

Figure 6:
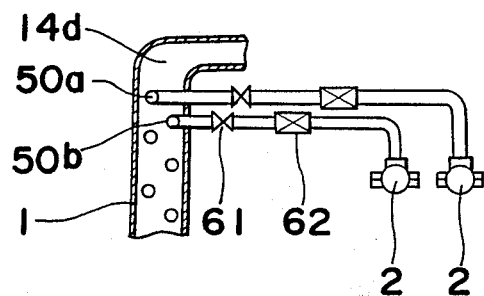
FIG. 6 is an explanatory view showing a modified form of heat exchange portion of a feed pipe for chemical liquids.

In the embodiment just above described, only the developer has been referred to, and one heat exchanger 50 for temperature control of the developer is disposed within the chamber 14d, but alternatively, as FIG. 6 illustrates, a heat exchanger 50a for controlling the temperature of the developer and a heat exchanger 50b for controlling the temperature of the pretreating liquid which is sprayed prior to the spraying of the developer may be disposed inside the chamber 14d.

A heat exchanger (not shown) for controlling the temperature of a post-treatment liquid can of course be arranged in the chamber 14d.

As stated above, the heat exchange chamber 14d facing the developing chamber 10 is formed in the developing tank 300 and the heating medium supply unit 7 is connected to the heat exchange chamber 14d through the pipings 76, 77 for circulation of the constant-temperature heating medium to and from the chamber 14d, and further, the heat exchanger 50 for temperature control of the chemical liquid is disposed in the heat exchange chamber 14d. Through such arrangement it is possible to make the entire apparatus more compact, and yet to preset the temperature of the developing chamber 10 as desired and to prevent variations in temperature from being caused with respect to the developing chamber 10 and the chemical liquid. Therefore, any possible variation in the resist sensitivity due to changes in the development temperature, if any, may be minimized and an improved product yield can thus be obtained with photoplates, such as semiconductor wafers.

Figure 7:
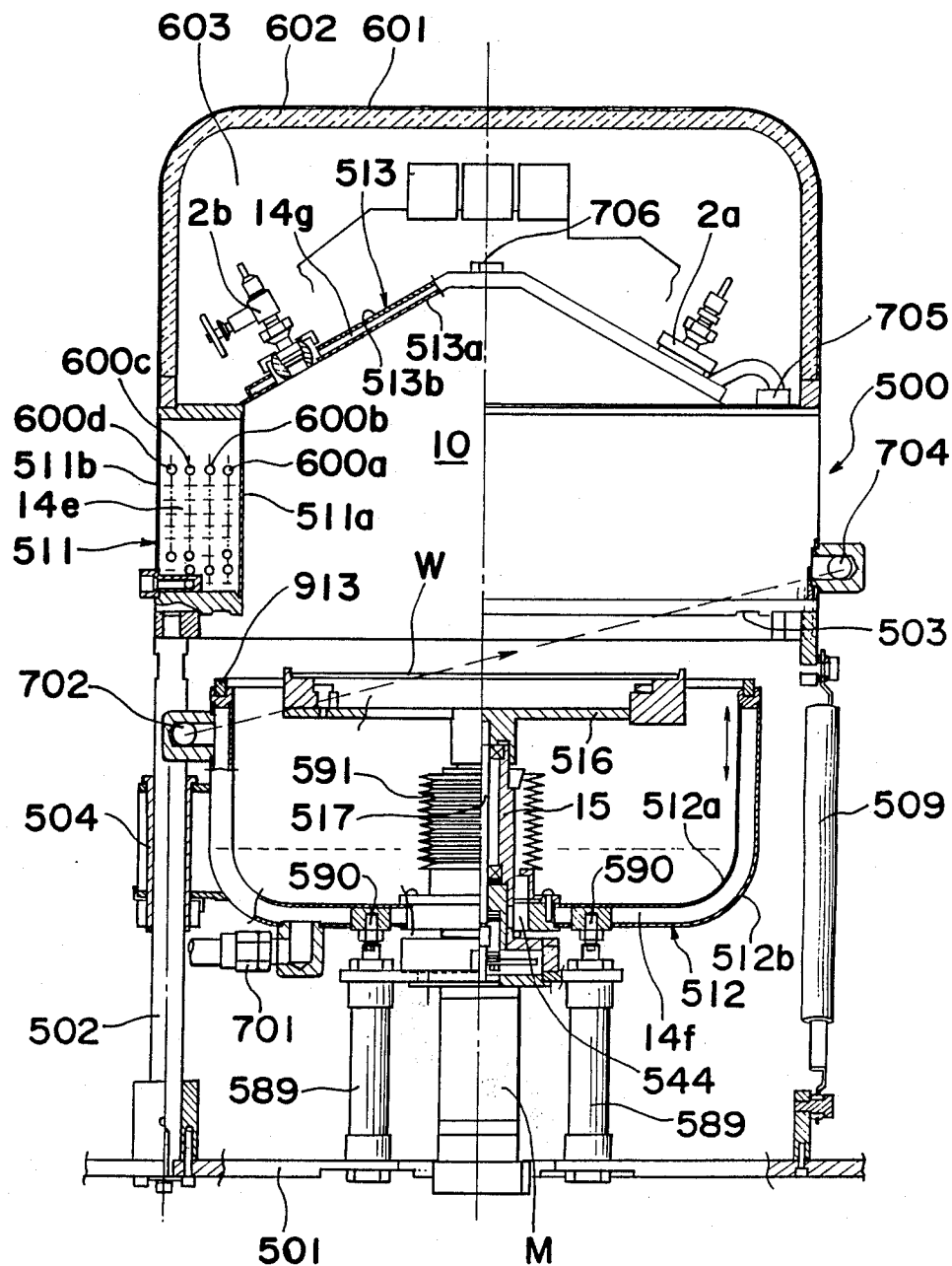
FIG. 7 is a front view, partly in section, of a fourth embodiment of the invention.
Figure 8:
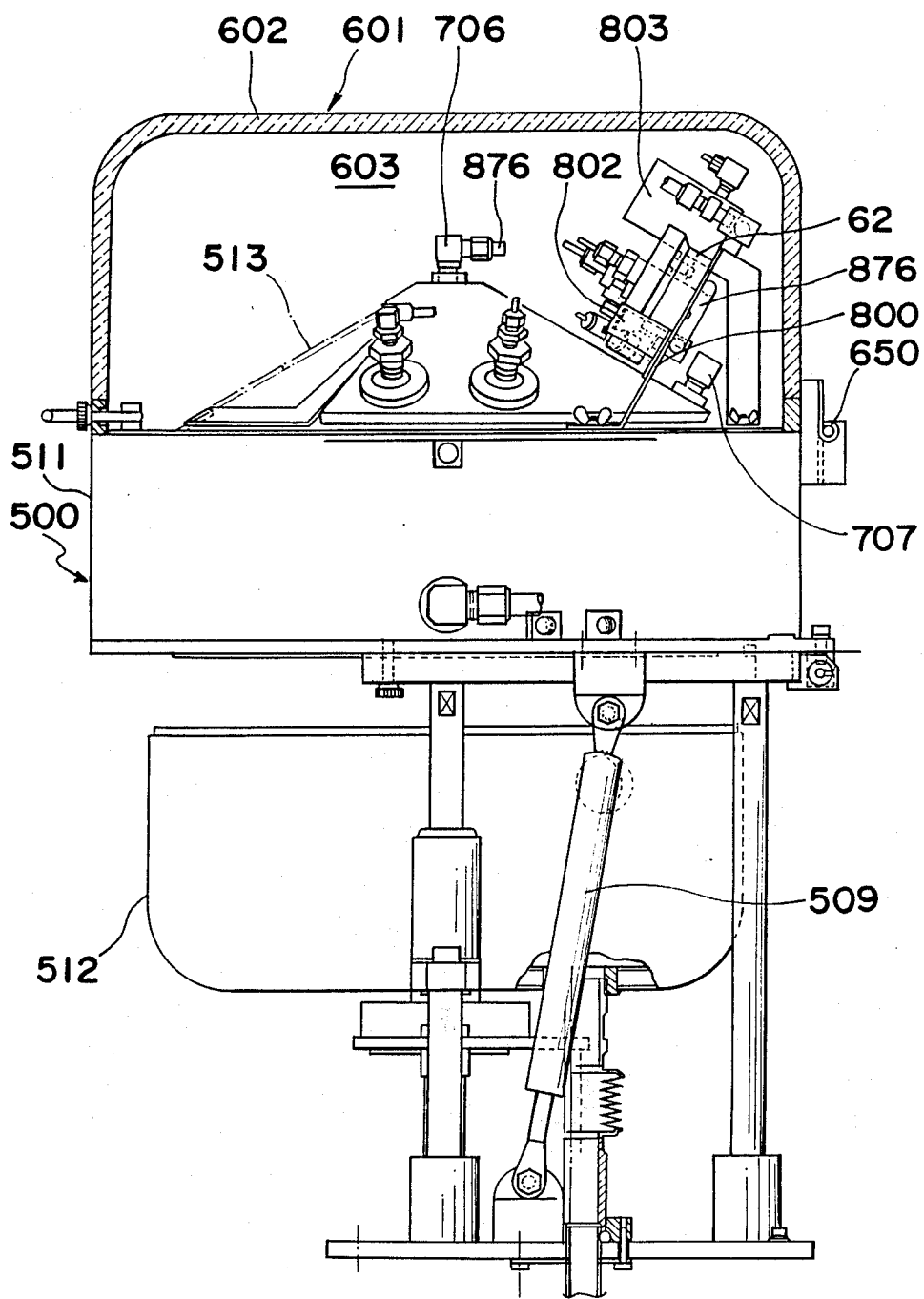
FIG. 8 is a side view of the fourth embodiment.
Figure 9:
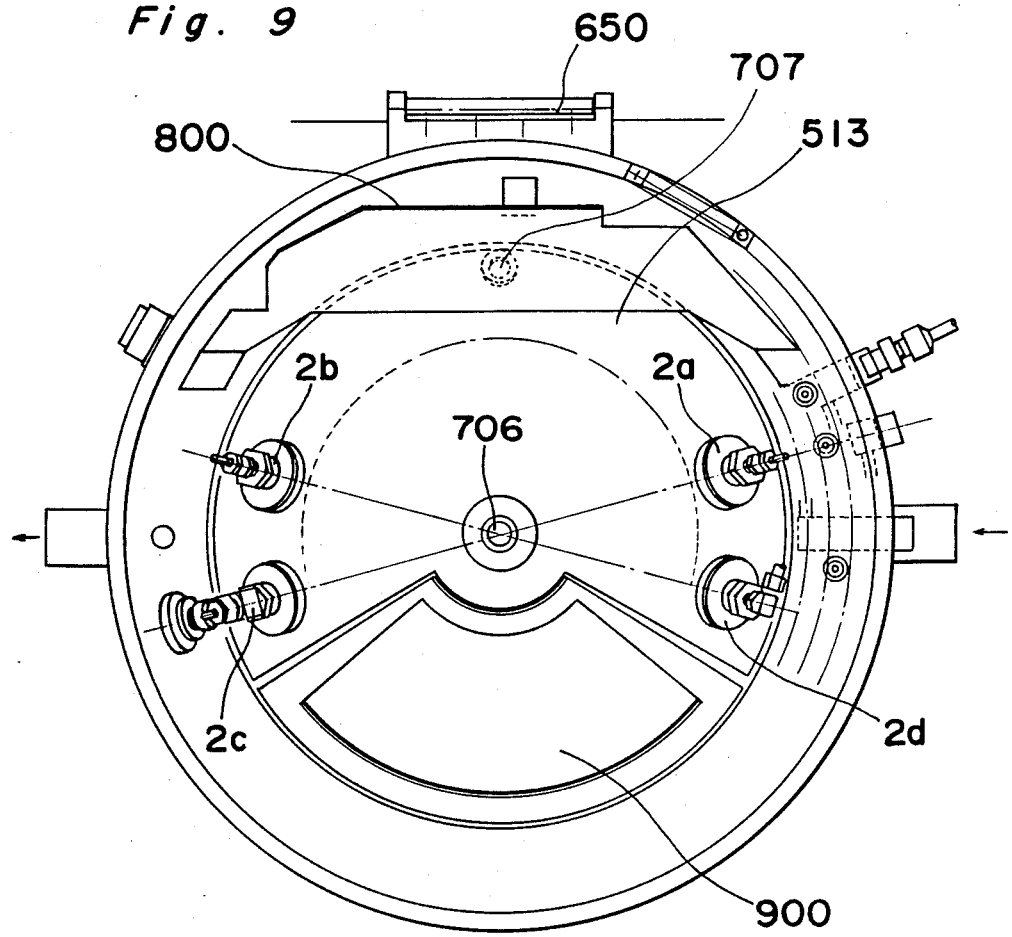
FIG. 9 is a plan view of the fourth embodiment.

FIGS. 7, 8, and 9 show a developing tank 500 in fourth embodiment. This developing tank 500 comprises a body portion 511 having an inner wall 511a and an outer wall 511b between which a heat exchange chamber 14e is defined, a bottom portion 512 having an inner wall 512a and an outer wall 512b between which a heat exchange chamber 14f is defined, and a top protion 513 having an inner wall 513a and an outer wall 513b between which a heat exchange chamber 14g is defined. The body portion 511 is supported at one side end on a column 502 which stands upright on a base plate 501 and is connected at the other side end to the base plate 501 by an open - close service damper 509. The bottom portion 512 is fixed to a guide member 504 fitted up and down movably on the column 502. Therefore, the bottom portion 512 is up and down movable. The bottom portion 512 has a through-hole 544 bored centrally therein, with a cylindrical support member 15 extending through the through-hole 544 and fixed to the base plate 501 through casings of pneumatic cylinders 589, 589 as actuators. Wafer or mask substrates W are mounted in a chuck 516 fixed on the top of a rotary shaft 517 extending through a cylindrical support 15. The rotary shaft 517 is driven by a motor M to rotate. The bottom portion 512 is fixed on the upper ends of piston rods 590 of the pneumatic cylinders 589 and is movable up and down relative to the cylindrical support 15 and chuck 516 by actuating the pneumatic cylinders 589. A bellows 591 is mounted about the upper portion of the cylindrical support 15 and the through-hole 544 of the bottom portion 512 at a lower central part thereof to seal the through-hole 544. At the upper end of the bottom portion 512 there is fixed a ring-shaped seal member 913 so that the bottom portion 512 and the body portion 511 may be brought into hermetic contact with each other by moving the bottom portion 512 upward by the pneumatic cylinders 589 to cause the upper end of the bottom portion 512 to go into close contact with an annular groove 503 in the lower end of the body portion 511. Inside the body portion 511 there are disposed in position heat exchange coils 600a, 600b, 600c, and 600d for passage of chemical liquids or nitrogen gas therethrough. These heat exchange coils 600a, 600b, 600c, 600d are connected respectively to nozzles 2a, 2b, 2c for different chemical liquids and to a nozzle 2d for spraying jets of nitrogen gas for drying. The nozzles 2a, 2b, 2c, 2d are disposed in the top portion 513, as shown in FIG. 9.

Figure 10:
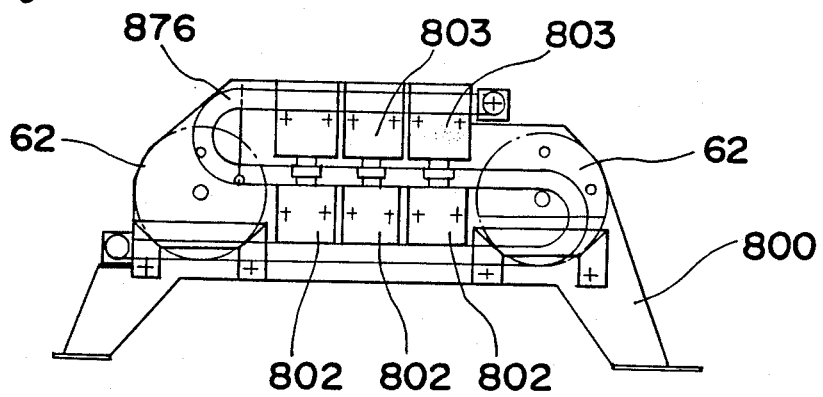
FIG. 10 is a side view of a valve and the feed pipe disposed in an insulated chamber of FIG. 9.

A casing 601 for covering the top portion 513 is mounted to the body portion 511 by means of a hinge 650 (see FIG. 8) so that it may be opened and closed. A dust-free heat insulating member 602, such as foamed polystyrene or the like, is bonded to the inner surface of this casing 601. Alternatively, glass wool as a heat insulation material, not shown, may be bonded to the inner surface of the casing 601, the inner surface of the glass wool being coated with aluminum foil or the like so as for it not to produce dust or the like. A heat insulated chamber 603 is defined between the heat insulation material 602 and the top portion 513. As FIGS. 8 and 10 show, a strainer 62, a valve 802 for chemical liquid, and a suck-back valve 803 for preventing fall of chemical liquid drops during chemical liquid shut-off are mounted to a bracket 800 fixed to the top portion 513. Further, as can be seen from FIGS. 8 and 10, the valves 802, 803 are held in contact with a pipe 876 for passage of chemical liquid connected to a heating-medium outlet 706 located at the center of the top portion 513 so that heat exchange may be effected between the valves 802, 803 and the heating medium, whereby the temperature of the chemical liquid is controlled to same temperature as that of the heating medium. That is, the pipe 876 serves as a heat exchanger through its contact with the valves 802, 803. Shown by 900 in FIG. 9 is a transparent window.

As FIG. 7 illustrates, wafers W are set in position in the chuck 516 when the body portion 511 and the bottom portion 512 are separate from each other and then the bottom portion 512 is elevated so that the body portion 511 and the bottom portion 512 are brought into close contact through the seal member 513. Then, heating medium is fed to an inlet port 701 for heating medium located at the underside of the bottom portion 512 from a heating medium supply unit identical with the heating medium supply unit 7 shown in FIG. 5. The heating medium which has passed through the heat exchange chamber 14f goes through an outlet port 702 at the upper end of the chamber 14f, then after passing through a pipe not shown, the heating medium enters the heat exchange chamber 14e through an inlet 704 at the lower end of the body portion 511, then enters an inlet 707 of the heat exchange chamber 14g in the top portion 513 through an outlet 705 at the upper end of the body portion 511, then leaving the chamber 14g through an outlet 706; and subsequently it returns to the heating medium supply unit 7 after passing through the pipe 876. Surrounded by the heat exchange chambers 14f, 14e, 14g as above described, the developing chamber 10 inside the developing tank 500 is controlled to constant temperature. Valves 802, 803 (see FIG. 10) in the heat insulated chamber 603 are held in contact with the pipe 876 and are present in the heat insulated space 603 surrounded by the heat insulation material 602. Therefore, they are controlled to the same temperature as the heating medium without being subject to the influence of any external heat, so that the temperature of the chemical liquid is controlled to the desired temperature value.

Although the present invention has been described in connection with preferred embodiments thereof, many variations and modifications will now become apparent to those skilled in the art. It is preferred, therefore, that the present invention is limited not by the specific disclosure herein, but only by the appended claim.

What is claimed is:

1. A resist developing apparatus comprising:

a developing tank including a top portion, a body portion, and a bottom portion, wherein said top portion and said body portion have an inner wall and an outer wall, wherein a heat exchange chamber is defined between said inner and outer walls for being supplied with a heating medium, and wherein said bottom portion is operatively connected to said body portion with an actuator means so that said bottom portion may be separated from said body portion with said actuator means which moves said bottom portion towards and away from said body portion, said actuator means comprising pneumatic cylinders;

a holding means disposed inside said tank for holding a work piece in position;

a spray means disposed in said tank for spraying chemical liquids toward said work piece held by said holding means;

a heating medium supply means operatively connected to said tank for supplying heating medium at a specified temperature to said heat exchange chamber, said supply means including a heating medium tank for storing said heating medium, a heating medium temperature control means for regulating the temperature of said heating medium, and a heating medium pump for supplying said heating medium, wherein said heating medium temperature control means comprises a compressor, an evaporator and a condenser which are operatively connected for conducting a refrigeration cycle, and an electric heater;

heating medium piping connecting said heating medium supply means and said heat exchange chamber;

a heat insulation member covering said top portion of said tank, wherein a heat insulation chamber is defined between said outer wall of said top portion and said heat insulation member; and control means disposed in said heat insulation chamber for controlling the supply of chemical liquids to said spray means.

* * * * *